(12) United States Patent
Kaper et al.

(10) Patent No.: US 9,793,859 B1
(45) Date of Patent: Oct. 17, 2017

(54) AMPLIFIER OUTPUT POWER LIMITING CIRCUITRY

(71) Applicant: Raytheon Company, Waltham, MA (US)

(72) Inventors: Valery S. Kaper, Winchester, MA (US); John P. Bettencourt, Danvers, MA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 15/276,871

(22) Filed: Sep. 27, 2016

(51) Int. Cl.
*H03F 1/30* (2006.01)
*H03F 1/02* (2006.01)
*H03F 3/195* (2006.01)

(52) U.S. Cl.
CPC .......... *H03F 1/0216* (2013.01); *H03F 3/195* (2013.01); *H03F 2200/258* (2013.01); *H03F 2200/451* (2013.01)

(58) Field of Classification Search
CPC ............... H03F 1/30; H03F 3/04; H03G 3/30
USPC ........................................ 330/297, 296, 285
See application file for complete search history.

(56) References Cited

U.S. PATENT DOCUMENTS

| | | |
|---|---|---|
| 5,164,679 A | 11/1992 | Dittmer |
| 5,311,143 A | 5/1994 | Soliday |
| 5,337,006 A | 8/1994 | Miyazaki |
| 5,642,077 A | 6/1997 | Nagaraj |
| 5,909,127 A | 6/1999 | Pearson et al. |
| 6,603,358 B2 | 8/2003 | Shearon et al. |
| 6,664,842 B1 | 12/2003 | Pobanz |
| 6,710,651 B2 | 3/2004 | Forrester |
| 6,747,484 B1 | 6/2004 | Adlerstein et al. |
| 6,861,896 B2 | 3/2005 | Tsividis et al. |

(Continued)

FOREIGN PATENT DOCUMENTS

EP    1 739 827 B1    3/2008

OTHER PUBLICATIONS

Angel Bóveda, G. Luca Bonato, Olga Ripollés, GaAs Monolithic 1.5-2.5 GHz Image Rejection Receiver, IEEE, 1992, pp. 232-235 (4 pages).

(Continued)

*Primary Examiner* — Henry Choe
(74) *Attorney, Agent, or Firm* — Daly, Crowley, Mofford & Durkee, LLP

(57) ABSTRACT

An amplifier system having: an amplifier having a linear operating region where an output signal produced by the amplifier at the output terminal has a power level increasing proportionally with the increasing input signal power level up to a compression region of the amplifier where the output power is inhibited from increasing with increasing input signal power; and a DC current limiting circuit, coupled between a DC power supply and the amplifier, to: supply DC current from the DC power supply that is equal to quiescent current to the amplifier from the DC power supply when the amplifier operates in the linear region; enable the amplifier to draw increasing DC current from the DC power supply above the quiescent current with increasing input signal power until the output signal power reaches the desired compression point level which is lower than that of a stand-alone amplifier without the DC current limiting circuit; and, then limits the current drawn by the amplifier from the DC power supply.

7 Claims, 12 Drawing Sheets

(56) References Cited

U.S. PATENT DOCUMENTS

| | | | |
|---|---|---|---|
| 7,015,680 | B2 | 3/2006 | Moraveji et al. |
| 7,262,667 | B2 | 8/2007 | Gilsdorf et al. |
| 7,602,246 | B2 | 10/2009 | Zhang et al. |
| 7,873,335 | B2 | 1/2011 | Hug et al. |
| 7,960,997 | B2 * | 6/2011 | Williams .......... H01L 23/49575 324/762.09 |
| 2004/0072554 | A1 | 4/2004 | Henderson et al. |
| 2007/0188224 | A1 * | 8/2007 | Dow .................... H03F 1/14 330/129 |
| 2011/0221421 | A1 * | 9/2011 | Williams .......... H01L 23/49575 324/76.11 |
| 2017/0093353 | A1 * | 3/2017 | Lautzenhiser ....... H03G 3/3036 |

OTHER PUBLICATIONS

Robert Bayruns, Timothy Laverick, Norman Scheinberg, Kuoshiung Li Anadigics, Warren, NJ, A 5k 2GHz GaAs Transimpedance Amplifier Using a Low-Noise Active Load, IEEE International Solid-State Circuits Conference, 1991, pp. 272-273 (2 pages).

R.E. Leoni, III, S.J. Lichwala, J.G. Hunt, C.S. Whelan, P.F.Marsh, W.E.Hoke, T.E.Kazior, dc-45 GHz Metamorphic HEMT Travelling Wave Amplifier, IEEE GaAs Digest, 2001, pp. 133-136 (4 pages).

\* cited by examiner

Ohmic Region Resistance $R_{ohm}[\Omega] = \frac{dV}{dI} \approx 1.3 * R_{Mesa\_Rho}\left[\frac{\Omega}{square}\right] * \frac{L}{W}$ Saturation Region Saturation Current $I_{dss}[A] \approx I_{dss}\left[\frac{A}{mm}\right] * W[mm] < I_{max}[A]$ Ohmic Region Resistance $R_{ohm}[\Omega] = \frac{dV}{dI} \approx 1.3 * R_{Mesa\_Rho}\left[\frac{\Omega}{square}\right] * \frac{L}{W}$ Saturation Region Saturation Current $I_{dss}[A] \approx I_{dss}\left[\frac{A}{mm}\right] * W[mm] < I_{max}[A]$

AMPLIFIER OUTPUT POWER LIMITING CIRCUITRY

TECHNICAL FIELD

This disclosure relates generally to amplifier output power limiting circuitry.

BACKGROUND

As is known in the art, typical amplifiers have an input terminal for receiving an AC input signal; and, an output terminal where an amplified AC signal is produced as an output signal, as shown in FIG. 1. The relationship between the input signal power $P_{in}$ and the produced output signal power $P_{out}$ is indicated by curve A in FIG. 6. It is noted that in a linear operating region of the amplifier, the signal produced by the amplifier at the output terminal is directly proportional to the input signal; and, that in a non-linear region, the output signal is not directly proportional to the input signal. It is also noted that in a high input signal power region of the non-linear region the amplifier operates in a compression region ($P_{out}=P_{out\_comr\_A}$) where the output power signal is inhibited from increasing with an increase in the input signal. Thus, the compression operating region is a region where the amplifier produces its maximum output power.

More particularly, and considering here for example, a Field Effect Transistor (FET) amplifier, the FET (FIG. 1) is arranged in a conventional grounded source (S) configuration, having the input signal fed to the gate (G) of the FET through an AC coupling capacitor, and a drain (D) being AC coupled to an output terminal to provide an amplified output signal. A gate voltage Vgg is provided by a POWER SUPPLY 1 producing a voltage Vdc1=Vgg and a gate current Igg. A drain current, Idd, is supplied by a POWER SUPPLY 2 producing voltage Vdc2. The operating region of the FET is a function of: the power level of the input signal; and, a DC bias condition (DC bias current and/or voltage) applied to the FET from POWER SUPPLY 1 and POWER SUPPLY 2.

The FET has a predetermined quiescent operating state or Q-point established by the DC bias voltage level and current level fed to the FET. The quiescent point, or Q-point, is the steady-state (DC) voltage or current at a specified terminal of an active device (here the FET) with no input signal. The quiescent point is selected to achieve optimal performance in both linear and non-linear regions. One critical amplifier performance parameter in the linear region is $3^{rd}$ Order Intercept Point (IP3) which measures amount of $3^{rd}$ order distortions (intermodulations) that amplifier produces on its output when fed by an input signal containing two or more independent frequency tones. One critical amplifier performance parameter in the non-linear region is compressed output power ($P_{out\_comr}$) which measures maximum power that the amplifier is capable of producing at its output terminal when fed by an input signal containing one frequency tone.

With such an amplifier, when the input signal power increases so that the amplifier transitions from linear into non-linear regions, a DC current drawn by the amplifier from a DC bias power supply increases above the quiescent current $I_Q$ (as indicated by curve A in FIG. 7) and the power in the output signal correspondingly increases until the amplifier reaches the compression operating region and produces a maximum output power level $P_{out}=P_{out\_comr\_A}$ as shown in a curve A in FIG. 6. It is noted that there is nothing in the amplifier circuit of FIG. 1 that limits the amount of current $I_{dd}$ drawn by the amplifier from the POWER SUPPLY (FIG. 1). It is also noted that in this case, Vdd=Vdc2, as shown by curve A in FIG. 8.

In many receiver amplifier systems, there is a need to limit the maximum output power, $P_{out\_comr}$, of the system below the output power produced by a stand-alone amplifier that operates in its compression region, $P_{out\_comr\_A}$. This needs to be accomplished without degrading the amplifier's linearity (often measured by IP3) when the amplifier operates in its linear region. In a typical amplifier, $P_{out\_comr}$ is strongly correlated with the IP3. Therefore, it is in some applications, desirable to modify amplifier behavior in a way that affects only its non-linear region's characteristic ($P_{out\_comr}$), but not its linear region's one (IP3).

One technique used to solve this problem is a feedback or closed loop-control amplifier system, such as shown in FIG. 2. Here, a detector is placed somewhere within the signal path of the amplifier (at the input signal path to the amplifier, inside the signal path of the amplifier itself, or in the output signal path of the amplifier). When the signal becomes sufficiently large, the detector actuates a switch in the signal path (either internal or external to the circuit) to disconnect the circuit's output from downstream elements of the system. Alternatively, the detector may control the DC bias of the circuit to affect its output power. One problem with this technique is that it requires extensive control theory analysis to ensure its stability. The second problem is finite response time, i.e., time interval between signal becoming large enough and the switch being actuated. The third problem is that the system's linear region linearity is adversely affected by the switch's insertion loss, because it is situated in the AC signal path.

Another technique is to place a nonlinear component in the signal path as shown in FIG. 3. This component has a low insertion loss at low signal levels and high insertion loss above a predetermined threshold level. Once the circuit's output power exceeds this threshold level, its output power becomes limited by the high insertion loss of the limiter. With such an arrangement, however, the limiter's insertion loss in the low-power regime has negative effects on the circuit's linearity and gain, and, in the high power regime the limiter reflects AC signal at its input that may cause circuit instability and/or channel temperature increase of a transistor within the amplifier.

Another common technique that accomplishes the output power limiting is shown in FIG. 4. Here, a constant current source (active load) is connected between the DC POWER SUPPLY 2 and the drain of the FET amplifier to produce a constant DC current $I_Q$, both under the quiescent condition and with an input AC signal present. The amplifier draws this constant current independent of the input signal power level, as shown in the curve labeled B in FIG. 7. Thus, here Vdc1=Vgg and Vdc2>Vdd, where Vdc2 is the voltage produced by POWER SUPPLY 2 and Vdd is the voltage at the drain of the amplifier. The curve B in FIG. 6 shows the relationship of output power vs. input power for the circuit of FIG. 4. It is being noted that the output power of the amplifier shown in FIG. 4 is lower than the output power of the amplifier shown in FIG. 1, that is $P_{out}=P_{out\_comr\_B}<P_{out\_comr\_A}$. In this arrangement, however, for the circuit to operate in a constant current mode the voltage drop across the constant current source $V_{CCS,q}=(V_{dc2}-V_{dd})$ has to be larger than knee voltage $V_{knee}$, (the voltage at which the linear region transitions to the non-linear region), as shown in FIG. 10. This voltage drop across the constant current source lowers the quiescent voltage level at the $V_{dd}$ terminal of the amplifier as shown in the curve B in FIG. 8. As known in art, this lower quiescent voltage leads to lower DC power available to the amplifier, which, in turn, results, in degraded amplifier's IP3.

SUMMARY

In accordance with the present disclosure, an amplifier system is provided having: an amplifier having a linear operating region where an output signal produced by the amplifier at the output terminal has a power level increasing proportionally with the increasing input signal power level up to a compression region of the amplifier where the output power is inhibited from increasing with increasing input signal power, and a DC current limiting circuit, coupled between a DC power supply and the amplifier, to: supply DC current from the DC power supply that is equal to quiescent current to the amplifier from the DC power supply when the amplifier operates in the linear region; enable the amplifier to draw increasing current from the DC power supply above the quiescent current with increasing input signal power until the output signal power reaches the desired compression point level which is lower than that of the amplifier, and, then limits the current drawn by the amplifier from the DC power supply.

With such an arrangement, the amplifier system is able to operate as a linear system with minimal additional (in comparison to an amplifier itself) distortion for low power level input signals while limiting the current drawn by the amplifier at higher power level input signals thereby reducing the maximum power output of the amplifier system to a level below the compression region power level of the amplifier itself.

In one embodiment, a system is provided having an input terminal and an output terminal. The system includes an amplifier connected to the input terminal for receiving an input signal at the input terminal and for producing an output signal at the output terminal. The amplifier has a linear operating region where an output signal produced by the amplifier at the output terminal has a power level increasing proportionally with the increasing input signal power level and a compression operating region where the output signal power produced by the amplifier has a compression power level, $P_{out\_comr}$, invariant with increasing input signal power level when the power of the input signal is above a predetermined input power level. A DC current limiting circuit is coupled between a DC power supply and a bias terminal of the amplifier, for biasing the amplifier to limit the output power at the output terminal of the system to a level below the compression power level $P_{out\_comr}$ while enabling the output power of the system to vary proportionally with input signal power when the input signal power level is below the predetermined power level. The DC current limiting circuit: allows the amplifier to draw current from the DC power supply through the DC current limiting circuit having a first, substantially constant, level for a first range of input signal power level; allows the current drawn from the DC power supply through the DC current limiting circuit to increase from the first substantially constant level to a second, higher, level for a range of input power level greater than the first range of input signal power level; and, suppresses current being drawn from the DC power supply through the DC bias limiting circuit current from increasing above the second level for a third range of input signal power level greater than the second range of input signal power level.

In one embodiment, a circuit is provided having an amplifier that has an input terminal for receiving an input signal, an output terminal for producing an output signal; and a current supply terminal for receiving a bias current. The amplifier has a linear operating region and a compression region, the operating region of the amplifier being a function of the input signal, the amplifier amplifying the input signal to produce the output signal. A non-linear circuit is coupled between a DC voltage supply and the current supply terminal, the DC voltage supply providing a current to the amplifier through the non-linear circuit supplying a current to the amplifier through the current supply terminal, the current producing a voltage ($\Delta V$) across the non-linear, such voltage ($\Delta V$) being a function of the input signal, the non-linear circuit operating in a linear region when ($\Delta V$) has a first level, operating in a compression region when ($\Delta V$) has a second level greater than then first level, or operating in a transition region between the linear region and the compression region when ($\Delta V$) has a third level greater than the first level and lower than the second level, the non-linear circuit operating in the linear region of the non-linear circuit when the input signal operates the amplifier to in both the linear region of the amplifier and in the compression region of the amplifier.

The details of one or more embodiments of the disclosure are set forth in the accompanying drawings and the description below. Other features, objects, and advantages of the disclosure will be apparent from the description and drawings, and from the claims.

DETAILED DESCRIPTION

Figure 4:
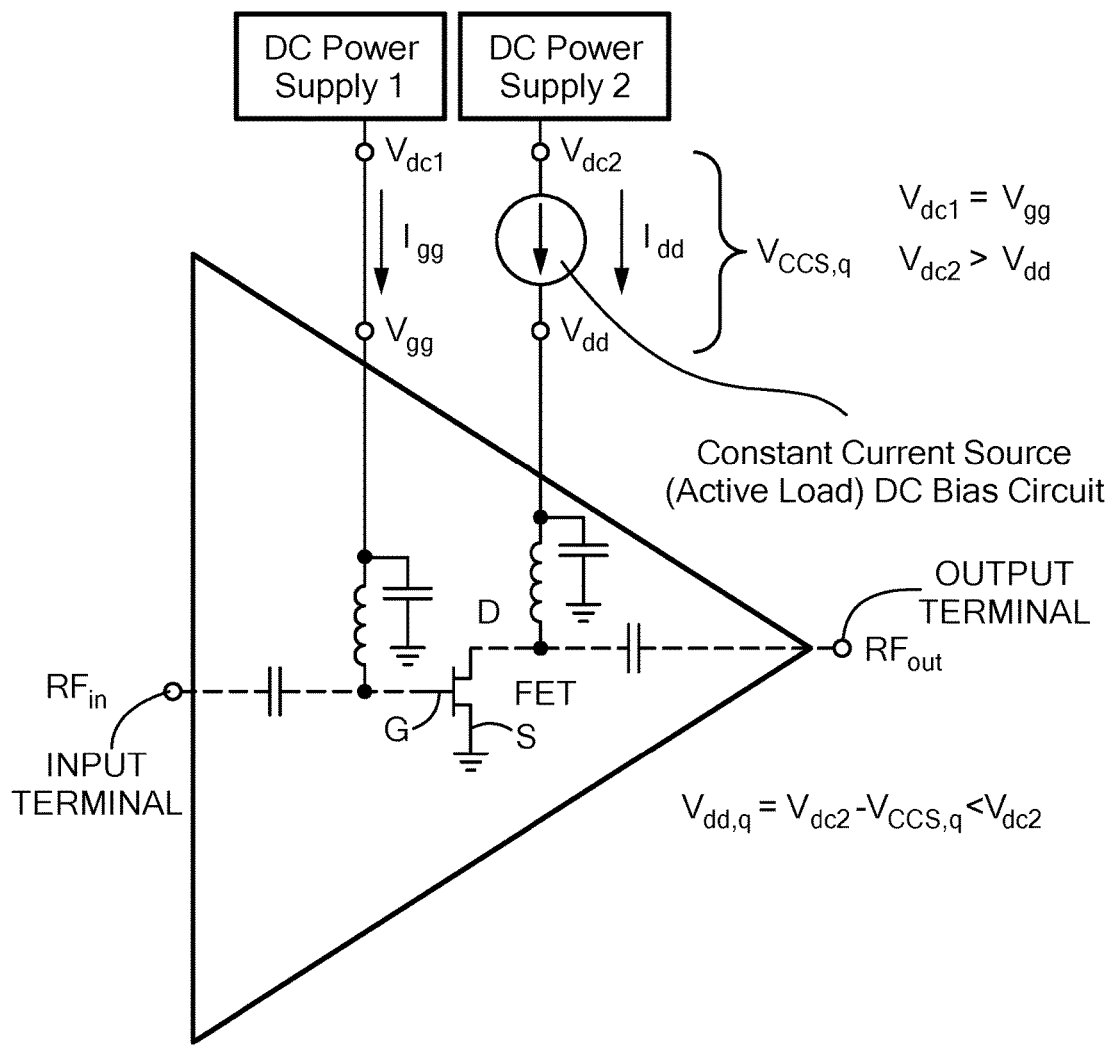
FIG. 4 is a diagram of a FET amplifier system according to the PRIOR ART.
Figure 5:
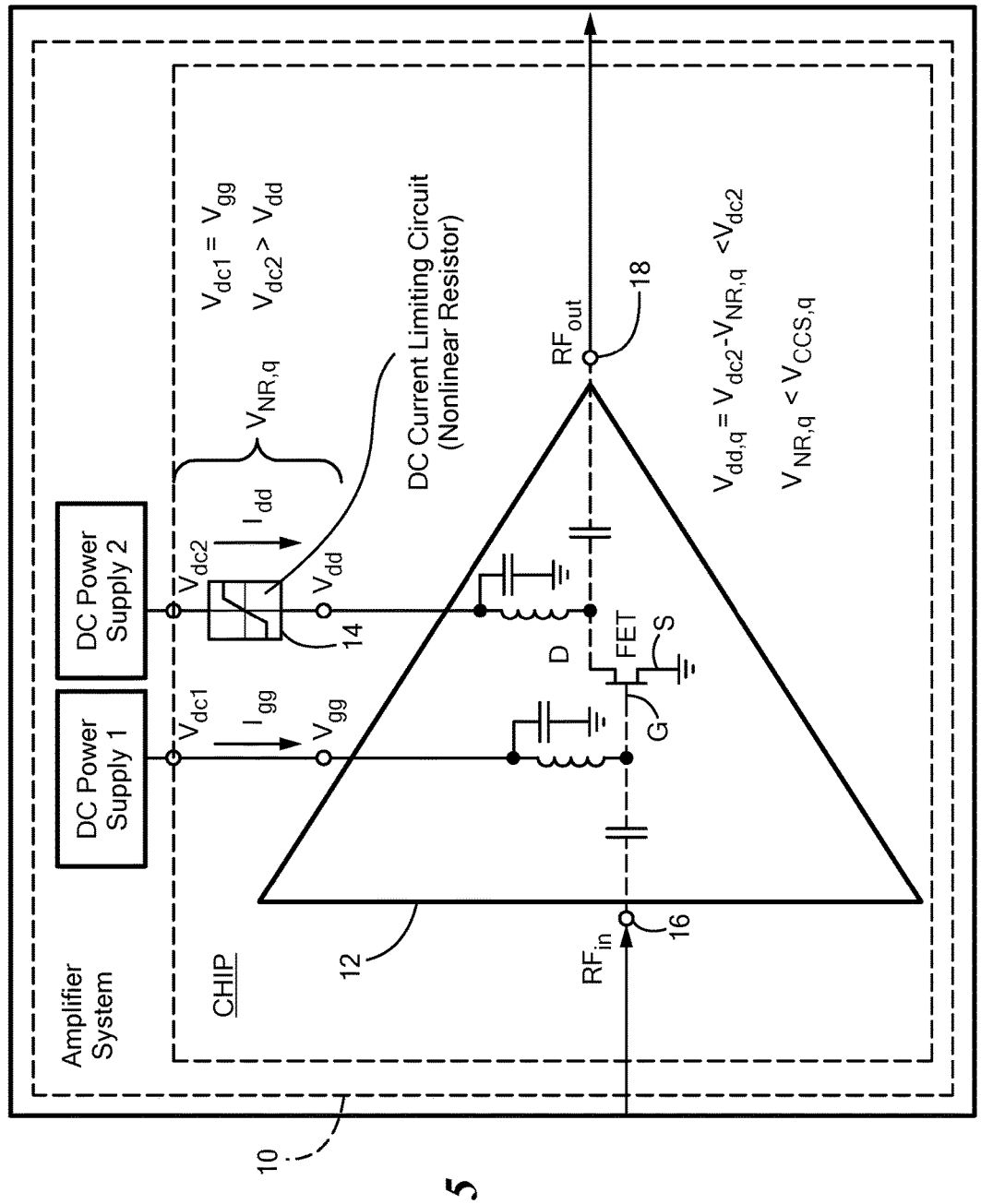
FIG. 5 is a diagram of a FET amplifier according to the disclosure.
Figure 6:
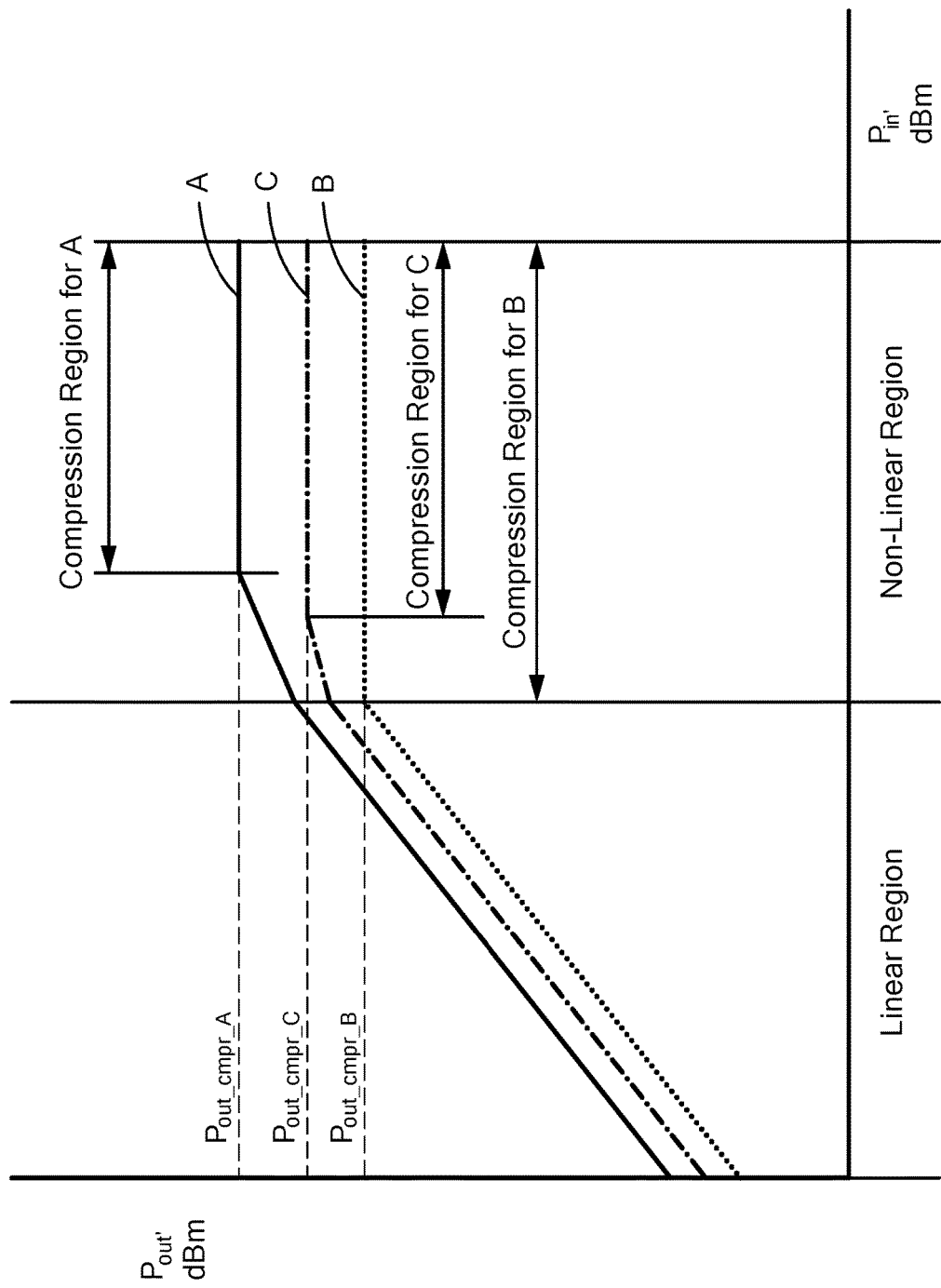
FIG. 6 is a set of curves showing the relationship between input power $P_{in}$ and output power $P_{out}$ for the FET amplifier of FIG. 1 (indicated by curve A), for the FET amplifier system of FIG. 2 (indicated by curve B), and the FET amplifier system of FIG. 5 (indicated by curve C)

Referring now to FIG. 5, an amplifier system 10 is shown. Here, in this example, the amplifier system includes FET amplifier 12 having a FET with a grounded source (S). The system 10 includes a DC POWER SUPPLY 1, producing a voltage Vdc1, coupled to the gate (G) of the FET amplifier 12 and a DC POWER SUPPLY 2 producing a voltage Vdc2. The amplifier system 12 includes a DC current limiting circuit 14 coupled between the FET amplifier 12 and the DC POWER SUPPLY 2, as indicated, producing a voltage Vdd at the drain terminal of the amplifier 12 and passing a current, Idd, to the drain of the FET in a manner to be described in more detail in connection with FIG. 10. It is noted that while here both the amplifier 12 and the DC current limiter 14 are on the same integrated circuit CHIP, it should be understood that the amplifier 12 and limiter circuit 14 may be on separate, electrically interconnected, integrated circuit chips. An input signal, here in this example an RF input signal, is fed to an input terminal 16 of the amplifier system 10 and AC coupled to the gate (G) of the FET amplifier 12. The amplified input signal is produced as an output signal at the drain and is AC coupled to an output terminal 18 of the amplifier system 10, as indicated. The DC POWER SUPPLY 1 supplies a gate bias voltage Vdc1=Vgg to the gate and a DC bias current Igg to the gate of the FET amplifier 12. The DC POWER SUPPLY 2 supplies a voltage Vdd to the FET amplifier 12 through DC current limiting circuit 14. The details of the DC current limiting circuit 14 will be described below, suffice it to say here that current Idd supplied to the FET amplifier 14 from the DC POWER SUPPLY 2 stays constant and equal to the quiescent current $I_Q$ while the amplifier is in the linear region and increases from the quiescent current $I_Q$ with increasing input signal power to a maximum current level $I_{LIMIT\_C}$ as indicated by curve C in FIG. 7 while the amplifier is in the non-linear region. Further, the current Idd produces a voltage drop, $\Delta V = V_{NR,q} = (Vdc2 - Vdd)$ across the DC current limiting circuit 14, where Vdd is the voltage at the drain of the FET amplifier 12 (where Vdc2>Vdd) and that the relationship between the input signal power Pin and the voltage Vdd is shown by curve C in FIG. 8. The relationship between input power $P_{in}$ and output power $P_{out}$ for the FET amplifier 12 in indicated by curve C in FIG. 6. It is also noted that $V_{dd,q} = V_{dc2} - V_{NR,q} < V_{dc2}$ and $V_{NR,q} < V_{CCS,q}$; where $V_{dd,q}$ is the quiescent drain bias voltage at the Vdd terminal of the FET amplifier 12, $V_{NR,q}$ is the voltage drop across the DC current limiting circuit 14 under the quiescent condition; and $V_{CCS,q}$ is the voltage drop across the constant current source of the system in FIG. 4 under the quiescent condition.

The DC POWER SUPPLY 1 and DC POWER SUPPLY 2 are set to establish the quiescent point of the FET amplifier 12. This quiescent point (Q-point) causes the FET amplifier 12 to draw a quiescent current $I_Q$ through the drain (D); that is, in the absence of, or at low input power levels, Idd=$I_Q$ at the quiescent point, as indicated by curve C in FIG. 7. In response to the power level of the input signal, the drain (D) of the FET amplifier 12 draws current Idd from the DC POWER SUPPLY 2 through the DC current limiting circuit 14, to be described in more detail below. The drawn current Idd produces a voltage drop, $\Delta V = (Vdc2 - Vdd)$ across the DC bias limiting circuit 14, where Vdd is the voltage at the drain of the FET amplifier 12 (where Vdc2>Vdd) and that the relationship between the drawn current Idd and the voltage drop $\Delta V$ is shown in FIG. 8. It is particularly noted that the DC current limiting circuit 14 is configured so that the current Idd passing through the DC current limiting circuit 14 increases to the maximum current level $I_{LIMIT}$ (a level less than the maximum current the FET amplifier itself is able to draw, as described above in connection with FIG. 1). It is still further noted that in this example, at current levels of Idd less than $I_{LIMIT}$, the voltage drop $\Delta V$ increases proportionately with Idd, here indicated as an ohmic region and that above $I_{LIMIT}$ the DC current limiting circuit 14 operates in a saturation region.

Figure 11:
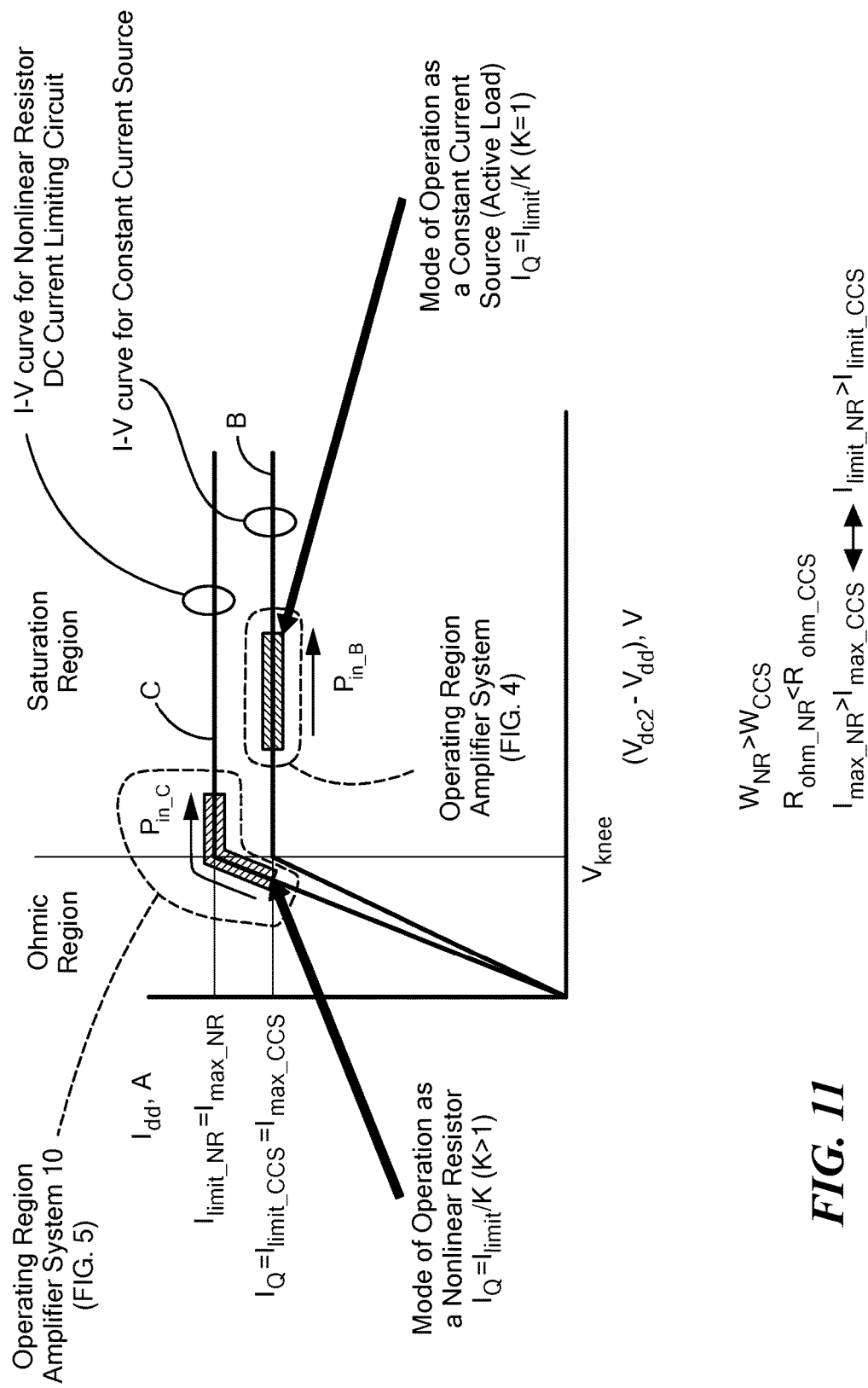
FIG. 11 is a pair of curves, one of the curves, labeled curve C, showing the relationship between a voltage produced across the DC biasing circuit of the PET amplifier of FIG. 5 and current drawn by the FET amplifier of FIG. 5 over the operating range of the FET amplifier of FIG. 5 and a second one of the pair of curves, labeled B showing the relationship between a voltage produced across the constant current source of the FET amplifier system of FIG. 4 over the operating range of the FET amplifier system of FIG. 4.

Referring to FIG. 11, the operating range of the DC current limiting circuit 14 over the I-V (Current vs. Voltage) operating range of the amplifier system 10 is indicated by the arrow $P_{in\_C}$ of curve C. Thus, it is noted that for low input power levels Idd=$I_Q$. As the input power increases, the current Idd increases above $I_Q$, the voltage drop $\Delta V$ across DC bias current circuit 14 increases proportionately until Idd reaches $I_{LIMIT}$ where the voltage drop $\Delta V$ across the DC bias limiting circuit 14 reaches $V_{KNEE}$. As the input signal power continues to increase, Idd remains at $I_{LIMIT}$ and the voltage drop ΔV continues to increase. By way of comparison, the I-V curve of the constant current source of the amplifier system in FIG. 4 is shown by the arrow Pin_B on curve B in FIG. 11. It is noted that the FET amplifier system in FIG. 4 operates with constant current at the quiescent current $I_Q$ and over its entire operating range and that the voltage drop across the constant current source is greater than the voltage drop, ΔV, across the DC current limiting circuit 14. Therefore, for the same Vdc2, the voltage at the drain (D) of the FET in the FET amplifier 12 of FIG. 5 is higher than the voltage at the drain (D) of the FET amplifier of FIG. 4. As a result, the FET amplifier 12 of FIG. 5, while operating in its linear region will have lower intermodulation distortion, which is synonymous to having higher IP3, than that in the FET amplifier of FIG. 4.

Figure 7:
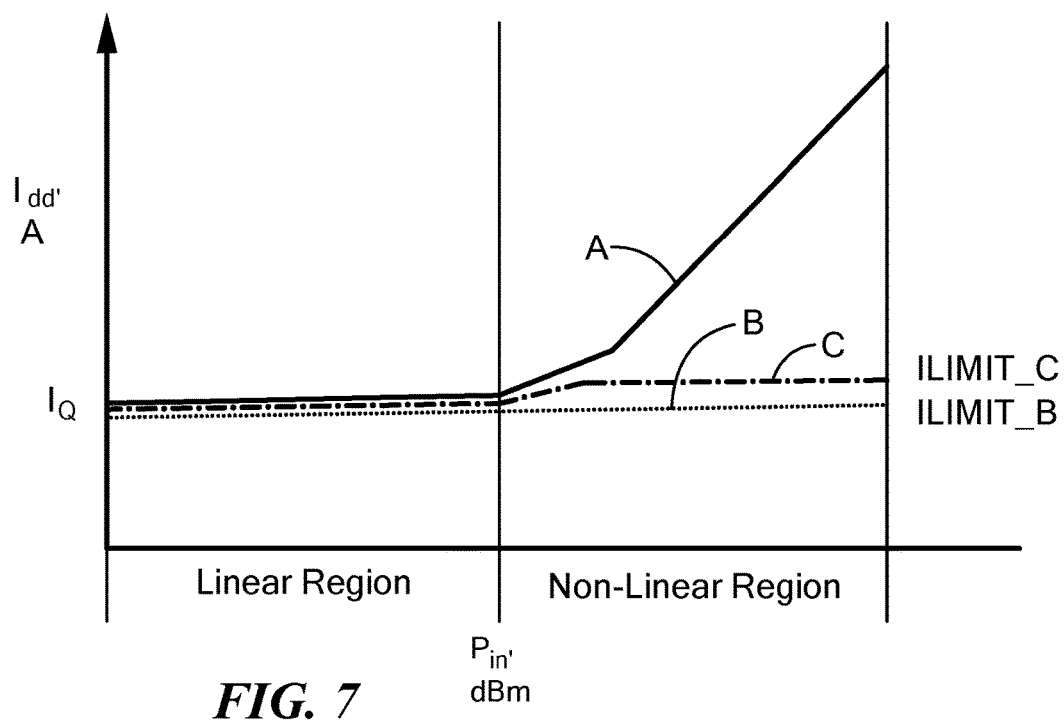
FIG. 7 is a set of curves showing the relationship between input power $P_{in}$ and current from a POWER_SUPPLY 2 to the FET amplifier of FIG. 1 (indicated by curve A), to the FET amplifier system of FIG. 2 (indicated by curve B), and to the FET amplifier system of FIG. 5 (indicated by curve C)
Figure 8:
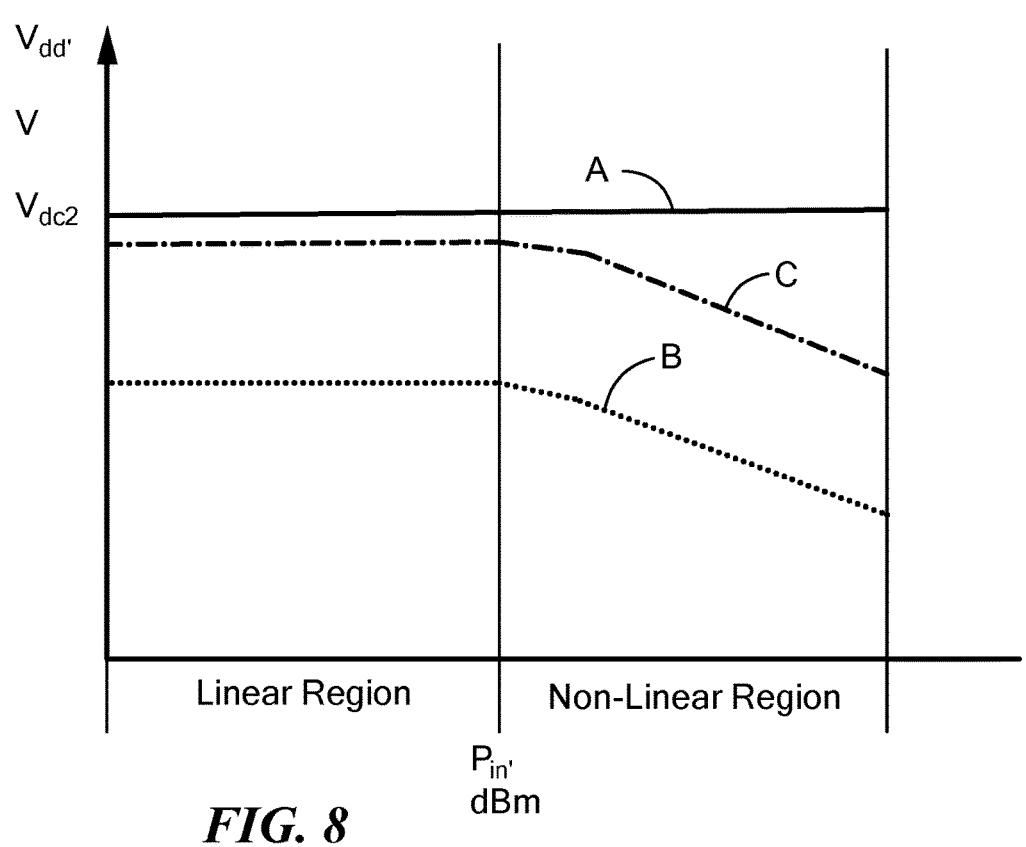
FIG. 8 is a set of curves showing the relationship between input power $P_{in}$ and a voltage produced at the drain of the FET amplifier of FIG. 1 (indicated by curve A), at the drain of the FET amplifier system of FIG. 2 (indicated by curve B), and at the drain of the FET amplifier system of FIG. 5 (indicated by curve C)

The relationship between Idd and input signal power of the amplifier system 10 is shown by curve C in FIG. 7. The relationship between $P_{in}$ and output power $P_{out}$ of the amplifier system 10 is shown by curve C in FIG. 6; it being noted that the maximum output power of the amplifier system 10 in FIG. 5 (curve C in FIG. 6) is less than the FET amplifier itself described above in connection with FIG. 1 (curve A in FIG. 6). The relationship between the voltage at the drain (D) of the amplifier system 10 is indicated by curve C in FIG. 8; it is being noted that, as described above, the voltage Vdd at the drain (D) of the FET in amplifier system 10 is lower than the voltage Vdd at the drain (D) of the FET in the amplifier of FIG. 4 due to voltage drop across the DC current limiting circuit 14.

Figure 13:
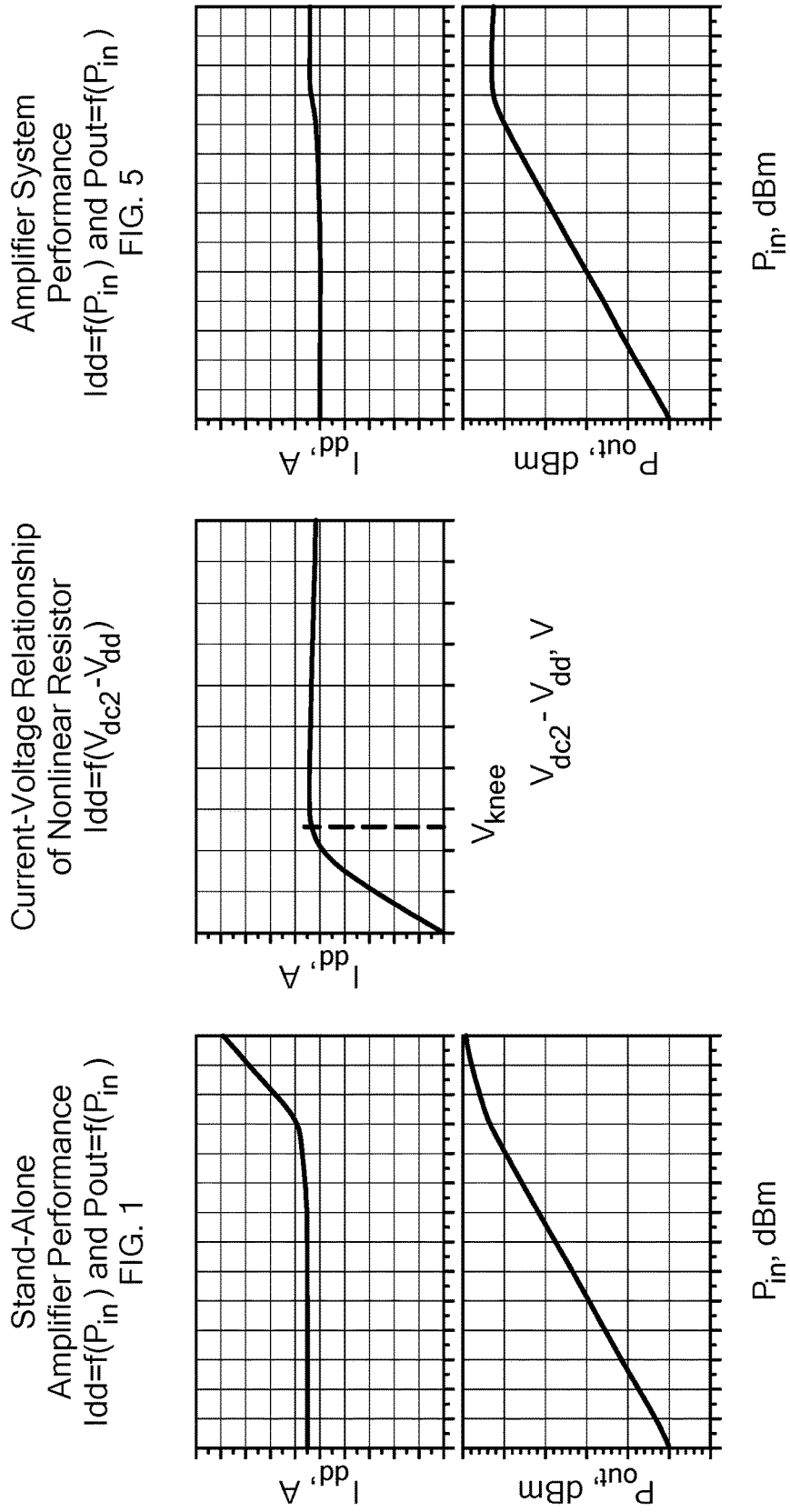
FIG. 13 are a set of curves useful in understanding the effect of the DC current limiting circuit used in the FET amplifier system of FIG. 5.

Referring to FIG. 13, the effect of inserting the DC current limiting circuit 14 on the amplifier system 10 performance in terms of Idd and Pout is shown. The upper and lower curves on the left show the relationships of Idd and $P_{out}$, respectively, as functions of input power for the FET amplifier of FIG. 1. The curve in the middle shows the relationship between Idd and ΔV=(Vdc2−Vdd) for the DC current limiting circuit 14; and the upper and lower curves on the right show the relationships between of Idd and $P_{out}$, respectively, as functions of input power for the FET amplifier 10 of FIG. 5. It is noted that the maximum output power $P_{out}$ of the FET amplifier 10 of FIG. 5, is lower than the maximum output power $P_{out}$ of the FET amplifier FIG. 1.

Figure 1:
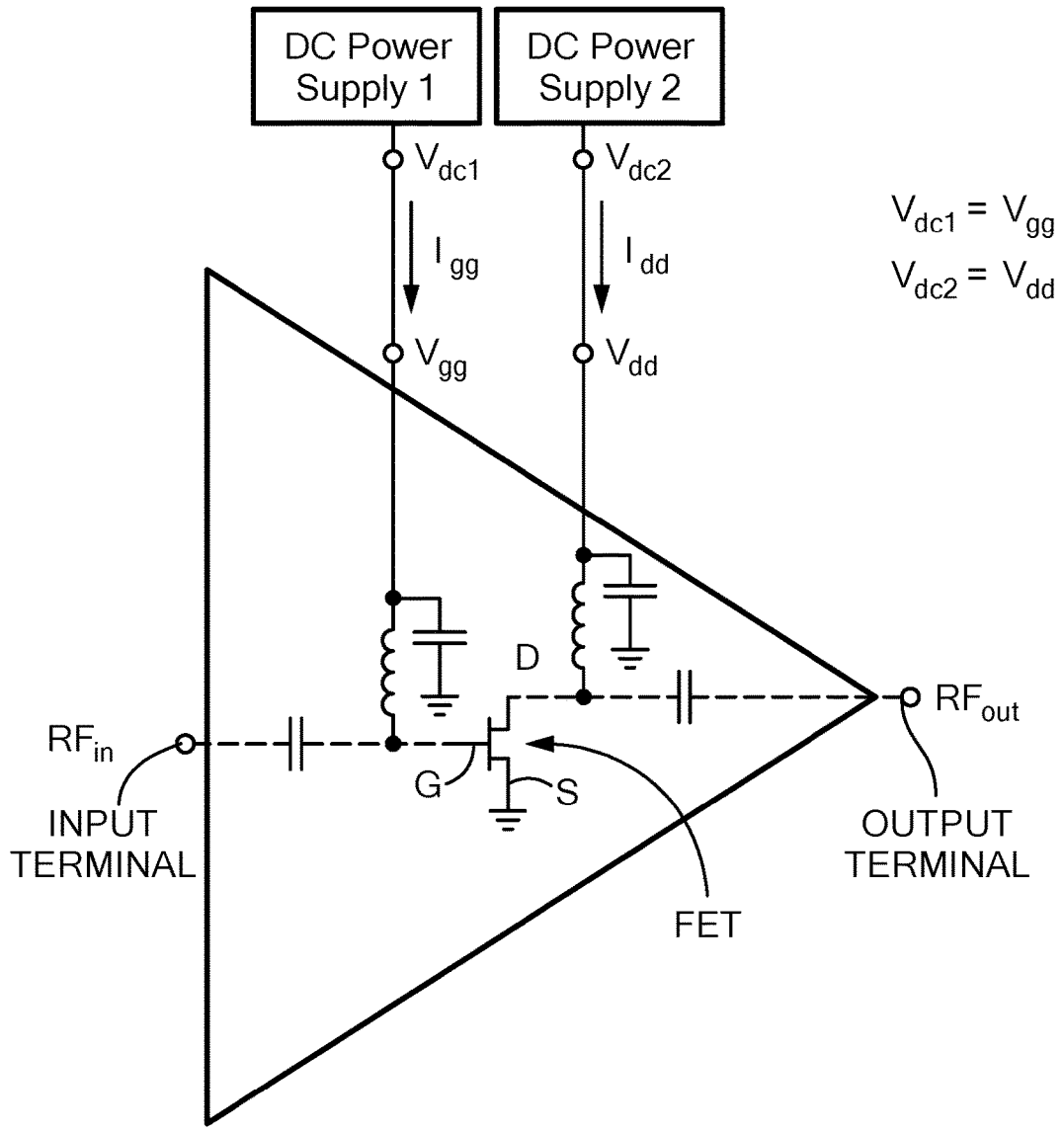
FIG. 1 is a diagram of a FET amplifier according to the PRIOR ART.
Figure 2:
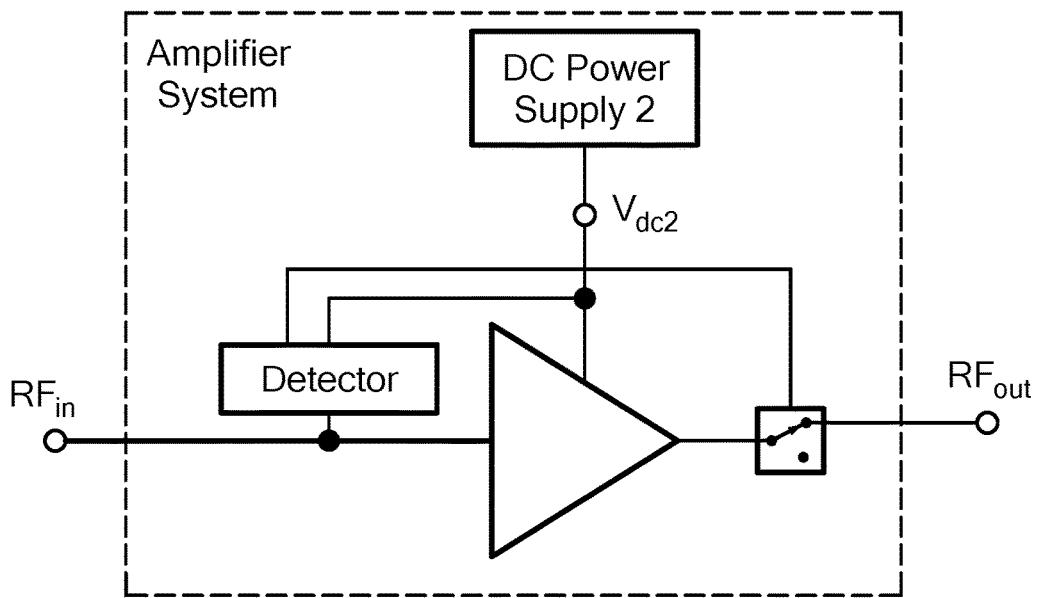
FIG. 2 is a diagram of a FET amplifier system according to the PRIOR ART
Figure 3:
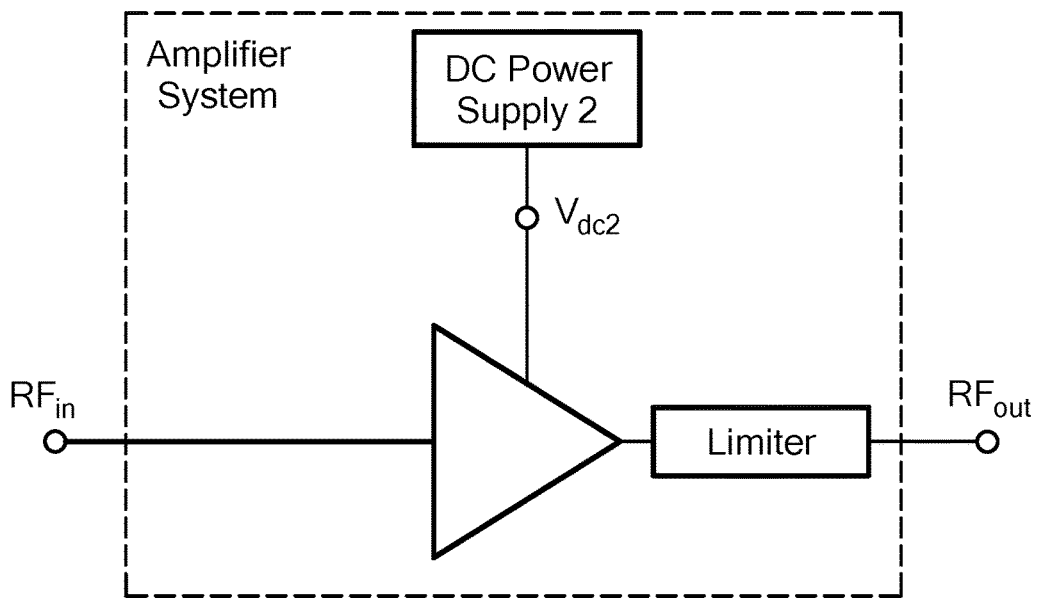
FIG. 3 is a diagram of a FET amplifier system according to the PRIOR ART.

Thus, to put it another way, the DC current limiting circuit 14 acts as a nonlinear resistor. When the amplifier 10 is in the quiescent state or in the linear region, the DC bias limiting circuit 14 is in a low-resistance state (where the DC current limiting circuit has a resistance R1, FIG. 10); a voltage drop ($V_{dc2}-V_{dd}$) across the DC current limiting circuit 14 is small and equal to the product of $I_Q$ and resistance of the DC current limiting circuit 14, thus the DC voltage at the $V_{dd}$ terminal of the amplifier is lower than that for a stand-alone amplifier in FIG. 1 without the DC bias limiting circuit 14 by a small value of the voltage drop ($V_{dc2}-V_{dd}$) where ($V_{dc2}-V_{dd}$)<$V_{KNEE}$; DC power available to the amplifier is not significantly smaller than that for a stand-alone amplifier in FIG. 1 without the DC current limiting circuit 14; as a result, the amplifier system's IP3 is not significantly lower than that of a stand-alone amplifier (FIG. 1). As the amplifier 10 enters its non-linear region, it draws increasing amount of DC current $I_{dd}$ through the DC current limiting circuit 14 from the DC POWER SUPPLY 2. The DC current limiting circuit 14 remains in its low-resistance state until $I_{dd}$ reaches a certain current level ($I_{limit}$), when the DC current limiting circuit 14 moves into a high-resistance state (where the DC current limiting circuit has a resistance R2>>R1, typically two orders of magnitude greater, FIG. 10) wherein the DC current limiting circuit 14 limits the $I_{dd}$ to $I_{limit}$. Continuing increase in input power level leads to $I_{dd}$ remaining constant and equal to $I_{limit}$ (as shown in curve labeled C in FIG. 7; the DC current limiting circuit 14 voltage drop ($V_{dc2}-V_{dd}$) increasing (as shown in curve labeled C in FIG. 8); $V_{dd}$ decreasing; $P_{out}$ is being inhibited to increase beyond a level $P_{out\_comr\_C}$ as shown in curve labeled C in FIG. 6 which is lower than that for a stand-alone amplifier (FIG. 1) (as shown in curve labeled A in FIG. 6). Thus, with such an arrangement of the amplifier system 10 of FIG. 5, the two goals of limiting output power in the non-linear region and preserving IP3 in the linear region are being achieved.

Thus, the amplifier 12 has a linear operating region wherein the amplifier operates in accordance with the superposition principle (that is, the net response at a given place and time caused by two or more stimuli is the sum of the responses which would have been caused by each stimulus individually) and a compression operating region where the output signal power produced by the amplifier 12 has a compression power level, $P_{out\_comr}$, invariant with the input signal power level when the power of the input signal is above a predetermined input power level. Further, the DC current limiting circuit 14 biases the amplifier 12 to limit the maximum output power at the output terminal of the system 10 to a level below the compression power level $P_{out\_comr}$ while the system 10 operates in its compression region.

Figure 9:
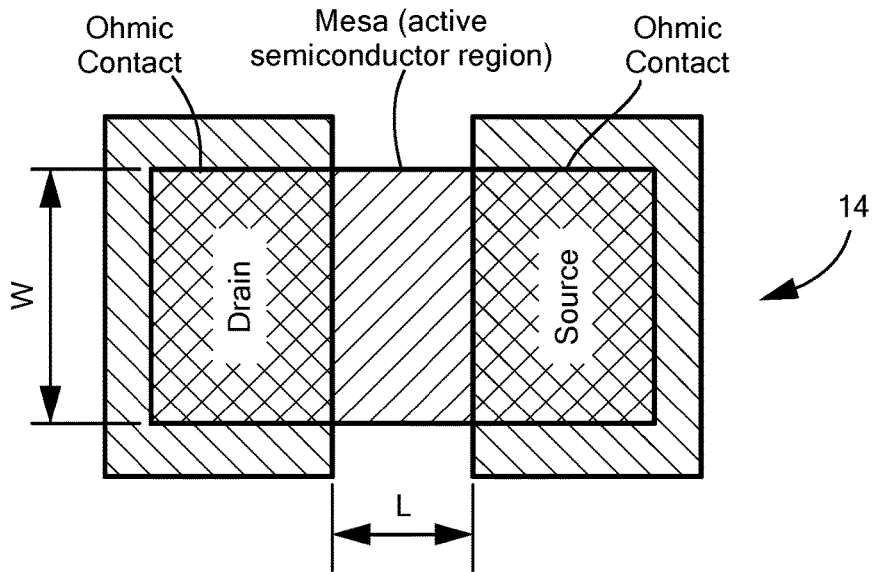
FIG. 9 is a top view of a structure, Nonlinear Mesa Resistor (NMR), used as a DC current limiting circuit used in the FET amplifier system of FIG. 5, such structure having relationship between voltage across it and current through it with two distinct regions: first where the current and the voltage are proportional and second where the current is independent of the voltage according to the disclosure.
Figure 10:
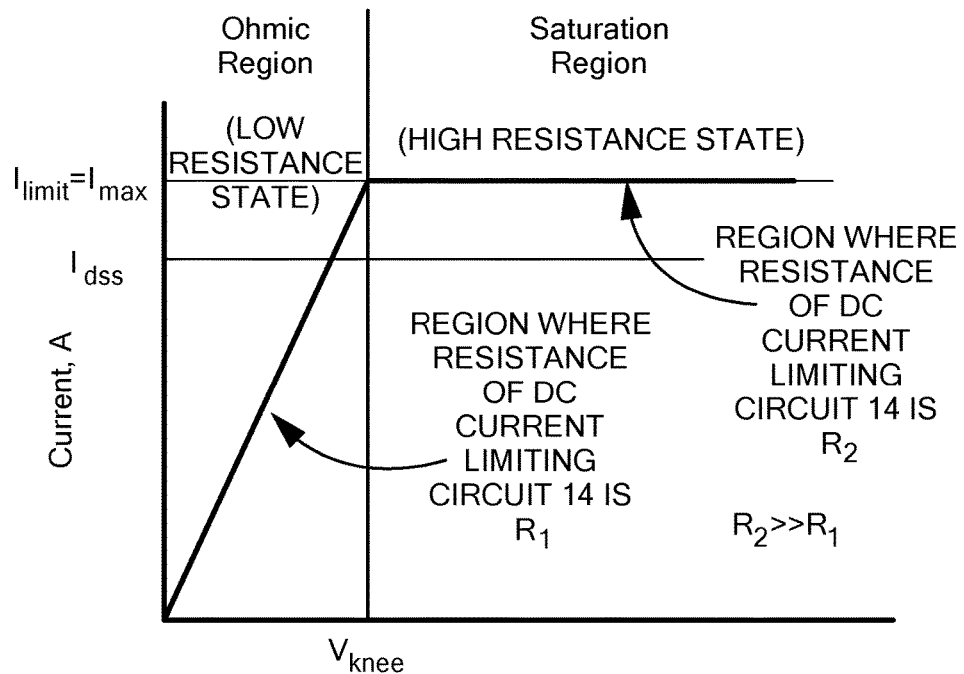
FIG. 10 is a curve showing the relationship between a voltage ($V_{dc2}-V_{dd}$) across the a DC current limiting circuit of FIG. 9 and current drawn by the FET amplifier of FIG. 5, such voltage being produced by the current passing from a POWER_SUPPLY 2 for the amplifier through a DC current limiting circuit of FIG. 9 coupled between the POWER_SUPPLY 2 and the drain of the FET amplifier of FIG. 5.

Referring to FIG. 9, here the DC current limiting circuit 14 having the relationship between a voltage produced at the drain of the FET amplifier of FIG. 5 as a function of current drawn by the FET amplifier of FIG. 5 shown in FIG. 10 is implemented with a Nonlinear Mesa Resistor (NMR). The NMR is formed by placing two ohmic contacts on two opposite sides of a rectangular semiconductor active region. Its current-voltage relationship includes an ohmic (low-resistance) region where the voltage drop across the resistor is approximately proportional to the current through the resistor by coefficient of proportionality, Ohmic Region Resistance $R_{ohm}$; and a saturation (high-resistance) region where the current is substantially independent of the voltage drop and equal to Saturation Region Open-Channel Current $I_{max}$. Both $R_{ohm}$ and $I_{max}$ are defined by features of technology (mesa resistivity $R_{mess\_rho}$ and open-channel current normalized to a unit of width $I_{max}$[A/mm]) and physical dimensions (width W and length L). For example, in an AlGaAs/InGaAs/AlGaAs pseudomorphic High Electron Mobility Transistor (pHEMT) technology, $R_{mess\_rho}$ and $I_{max}$[A/mm] are determined mostly by thicknesses and mole fractions of the constituent epitaxial layers; and by doping concentration level of a pulse doping layer (not shown) in the structure. Thus, here $$\text{Ohmic Region } Resistance R_{ohm}[\Omega] = \frac{dV}{dI} \approx R_{Mesa\_Rho}\left[\frac{\Omega}{\text{square}}\right] * \frac{L}{W};$$

and Saturation Region Open-Channel Current $$I_{max}[A] \approx I_{max}\left[\frac{A}{\text{mm}}\right] * W[\text{mm}]$$

As shown in FIG. 11, to use the NMR as a DC current limiting circuit 14, it needs to be sized (i.e., L and W selected) in such a way that the amplifier's $I_Q$ falls in the NMR's ohmic region while the $I_{limit}$ is set to be equal to the NMR's $I_{max}$. In general, the length L is selected as small as possible to minimize the ohmic region's series resistance, and thus preserve IP3 of the amplifier system 10 of FIG. 5. The width W is selected based on the desired $I_{limit}$ to achieve required $P_{out\_cmpr\_C}$. FIG. 11 also illustrates how NMR can be sized to operate as a Constant Current Source (Active Load), representative of prior art performance shown in curves labeled B in FIGS. 6 and 12.

Figure 12A:
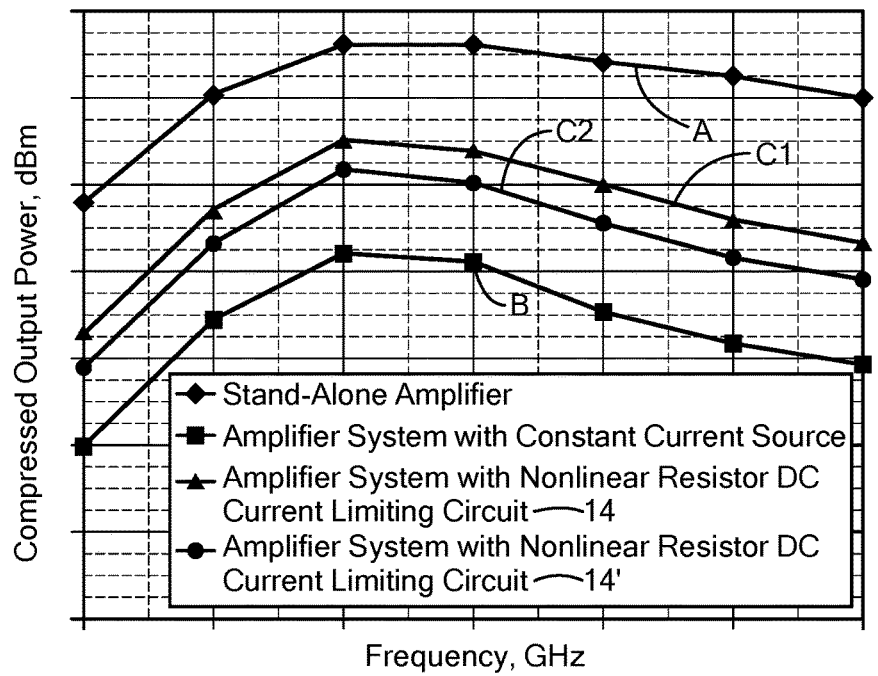
FIGS. 12A and 12B is a set of curves, produced from computer simulations, showing the relationships between compressed output power vs. input signal frequency (FIG. 12A) and $3^{rd}$ order output intercept point (OIP3) vs. input signal frequency (FIG. 12B) for the FET amplifier of FIG. 1 (indicated by curve A), for the FET amplifier system of FIG. 2 (indicated by curve B), and two curves for the FET amplifier system with NMR of FIG. 9 (indicated by curves C1 and C2 representing two different NMR configurations.
Figure 12B:
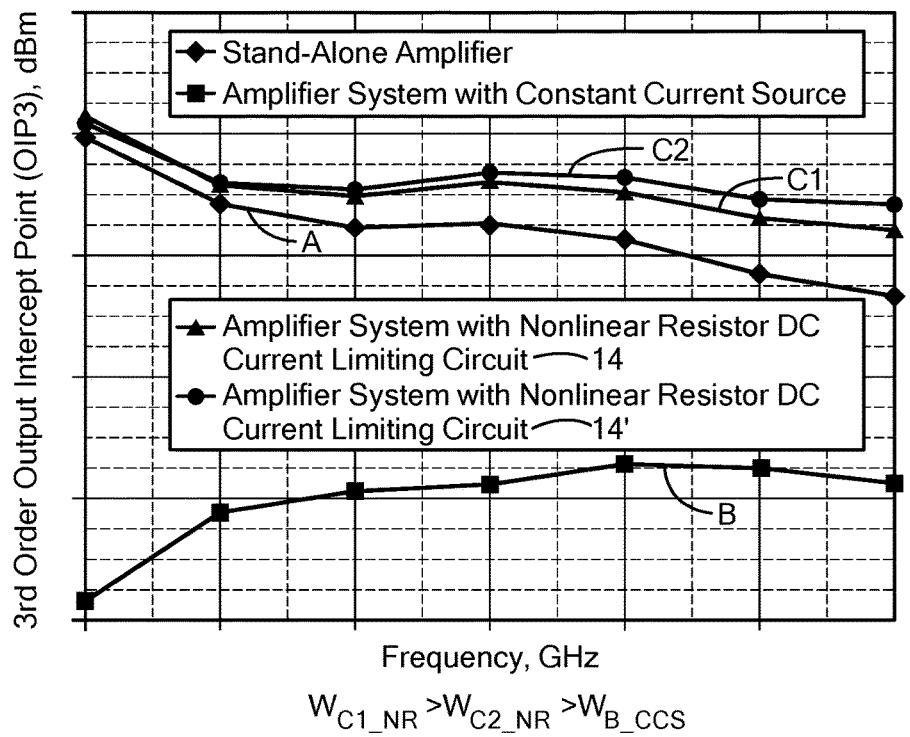

FIGS. 12A and 12B demonstrate the output power limiting capability of the amplifier system in FIG. 5 achieved while preserving the system's linearity. This is illustrated by simulation results of the compressed output power and $3^{rd}$ order output intercept point as functions of input signal frequency for: the amplifier of FIG. 1, indicated by curve A in FIG. 12; the amplifier of FIG. 4, indicated by curve B in FIG. 12; and the amplifier system 10 of FIG. 5, indicated by curves C1 and C2, respectively, in FIG. 12.

It is noted that $W_{NR} > W_{CCS}$ (where $W_{NR}$ is the width of the structure shown in FIG. 9 implemented as nonlinear resistor and where, for comparison purposes, $W_{CCS}$ is the width for the constant current source when implemented for use in the system of FIG. 4); $R_{ohm\_NR} < R_{ohm\_CCS}$ (where $R_{ohm\_NR}$ is the ohmic region's resistance of the structure shown in FIG. 9 implemented as nonlinear resistor and where, for comparison purposes, $R_{ohm\_CCS}$ is the resistance of the structure of FIG. 9 when implemented as the constant current source for use in the system of FIG. 4); and $I_{max\_NR} > I_{max\_CCS}$ (where $I_{max\_NR}$ is the saturation region's open-channel current of the structure shown in FIG. 9 implemented as nonlinear resistor and where, for comparison purposes, $I_{max\_CCS}$ is the saturation region's open-channel current of the constant current source when implemented for use the system of FIG. 4)↔ $I_{limit\_NR} > I_{limit\_CCS}$ (where $I_{limit\_NR}$ and $I_{limit\_CCS}$ are the desired limit currents of the structure shown in FIG. 9 implemented as nonlinear resistor and when implemented for use as a constant current source in the system of FIG. 4, respectively).

Referring to FIGS. 12A and 12B, an effect of NMR's width W on the linear region's IP3 and nonlinear region's compressed output power $P_{out\_cmpr}$ is demonstrated. An NMR with smaller width (curve C2) has lower $P_{out\_cmpr}$ and comparable IP3 than an NMR with larger width (curve C1). In general, smaller W leads to lower $I_{limit}$, and as a result, lower $P_{out\_cmpr}$. On the other hand, smaller W may result in higher $R_{ohm}$ and lower IP3. This trade-off can be quantified using a relationship between $I_Q$ and $I_{limit}$ as following: $I_Q = I_{limit}/K$. For the amplifier in FIG. 1 with no DC limiting circuit, K is infinitely large; in other words, $I_{limit}$ is infinitely larger than $I_Q$, resulting in no effect on IP3 and $P_{out\_cmpr}$. For the amplifier system with the constant current source in FIG. 4, K is equal to 1; in other words, $I_{limit}$ is set to be equal to $I_Q$, resulting in considerable limiting of $P_{out\_cmpr}$, but also a large adverse effect on IP3. The amplifier system according to the disclosure in FIG. 5, occupies the spectrum of K values larger than 1 and less than infinity, corresponding to the cases of the amplifiers in FIGS. 4 and 1 respectively. The larger is the K, the less is the limiting of $P_{out\_cmpr}$ and smaller is the reduction in IP3. Here, for example, for curve C1: K=1.14; and for curve C2: K=1.06.

Figure 14:
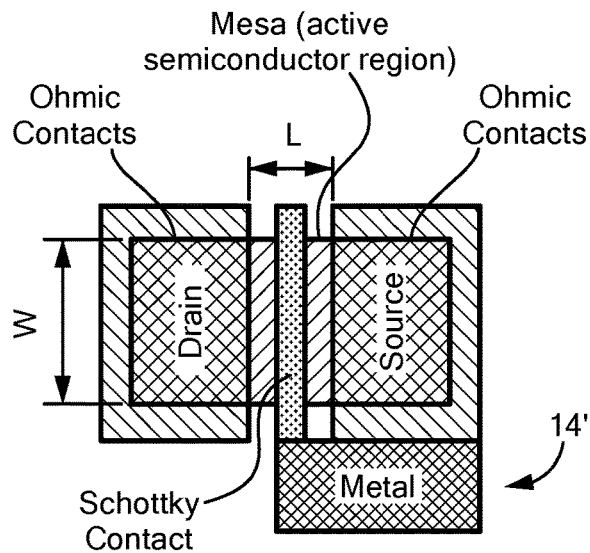
FIG. 14 is a top view of a structure used as the DC current limiting circuit in the FET amplifier system of FIG. 5, such structure having relationship between voltage across it and current through it with two distinct regions: first where the current and the voltage are proportional and second where the current is independent of the voltage according another embodiment of the disclosure.
Figure 15:
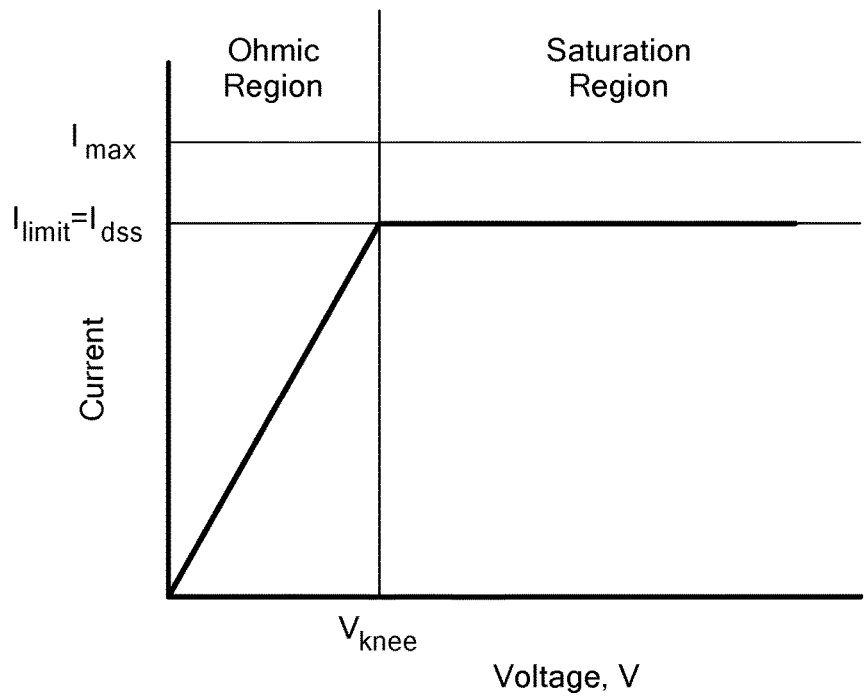
FIG. 15 is a curve showing the relationship between a voltage ($V_{dc2}-V_{dd}$) across the DC current limiting of FIG. 14 and current drawn by the FET amplifier of FIG. 5, such voltage being produced by the current passing from a POWER_SUPPLY 2 for the amplifier through the DC current limiting circuit of FIG. 14 coupled between the POWER_SUPPLY 2 and the drain of the FET amplifier of FIG. 5.
Figure 16:
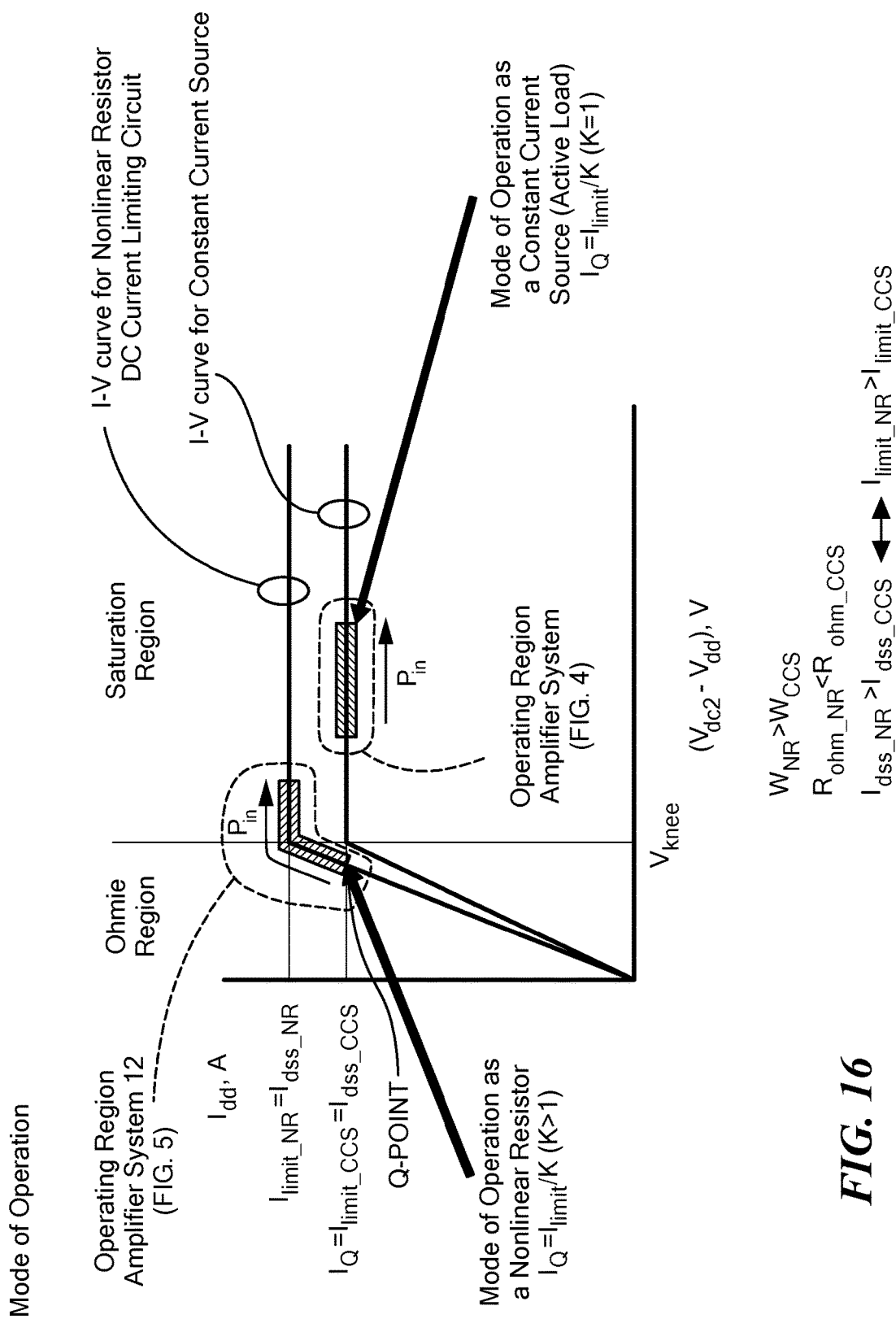
FIG. 16 is a pair of curves, one of the curves, labeled curve C, showing the relationship between a voltage produced across the DC current limiting circuit of the FET amplifier of FIG. 5 and current drawn by the FET amplifier of FIG. 5 over the operating range of the FET amplifier of FIG. 5 and a second one of the pair of curves, labeled B showing the relationship between a voltage produced across the constant current source of the FET amplifier system of FIG. 4 over the operating range of the FET amplifier system of FIG. 4.

Referring to FIG. 14, here a DC bias limiting circuit 14' is implemented as a FET with Connected Gate and Source Electrodes (FETSCGE). An FETSGE is formed by placing two ohmic contacts on two opposite sides of a rectangular semiconductor active region with a Schottky contact in between the two ohmic contacts; the Schottky contact and one of the ohmic contacts are connected by a metal strip outside of the semiconductor active region. Its current-voltage relationship (FIG. 15) includes an ohmic (low-resistance) region where the voltage drop across the resistor is approximately proportional to the current through the resistor by coefficient of proportionality, Ohmic Region Resistance $R_{ohm}$; and a saturation (high-resistance) region where the current is substantially independent of the voltage drop and equal to Saturation Region Saturation Current $I_{dss}$. Both $R_{ohm}$ and $I_{dss}$ are defined by features of technology (mesa resistivity $R_{mesa\_rho}$ and saturation current normalized to a unit of width $I_{dss}$[A/mm]) and physical dimensions (width W and length L). As shown in FIG. 15, to use FETSCGE as a DC bias limiting circuit 14', it needs to be sized (i.e., L and W selected) in such a way that the amplifier's $I_Q$ falls in the FETSCGE's ohmic region while the $I_{limit}$ is set to be equal to the FETSCGE's $I_{dss}$. Thus, Ohmic Region Resistance $R_{ohm}[\Omega] =$ $$\frac{dV}{dI} \approx 1.3 * R_{Mesa\_Rho}\left[\frac{\Omega}{\text{square}}\right] * \frac{L}{W} \text{ Saturation Region}$$

$$\text{Saturation Current } I_{dss}[A] \approx I_{dss}\left[\frac{A}{\text{mm}}\right] * W[\text{mm}] < I_{max}[A]$$

FIG. 15 also illustrates how FETSCGE can be sized to operate as a Constant Current Source (Active Load), representative of prior art performance shown in curves labeled B in FIGS. 5 and 12. It is noted that here, for purposes of comparison: $W_{NR} > W_{CCS}$ $R_{ohm\_NR} < R_{ohm\_CCS}$ and $I_{dss\_NR} > I_{dss\_CCS}$ ↔ $I_{limit\_NR} > I_{limit\_CCS}$ where $I_{dss\_NR}$ is the drain current for the amplifier 12 (FIG. 5) and $I_{dss\_CCS}$ is the drain current for the system of FIG. 4.

A number of embodiments of the disclosure have been described. Nevertheless, it will be understood that various modifications may be made without departing from the spirit and scope of the disclosure. For example, the amplifier may be a bipolar transistor amplifier, and other forms and technology may be used to form the DC current limiting circuit. Further, while the FET described above was a AlGaAs/InGaAs/AlGaAs pHEMT, which is a depletion-mode n-channel FET technology requiring positive quiescent drain-source voltage and negative quiescent gate-source voltage; the disclosure is applicable to other FET (n- or p-channel, depletion- or enhancement-mode, elemental semiconductor (Si) or compound semiconductor (GaAs, SiGe), homogeneous (GaAs) or heterogeneous (AlGaAs/InGaAs/AlGaAs)) and BJT (npn or pnp) technologies with modifications in the quiescent voltages' polarities. It should be further understood that the terms source and drain may be interchanged depending on the technology used. Accordingly, other embodiments are within the scope of the following claims.

What is claimed is:
1. An amplifier system, comprising:
   an amplifier having a linear operating region where an output signal produced by the amplifier at the output terminal has a power level increasing proportionally with the increasing input signal power level up to a compression region of the amplifier, and
   a limiter circuit, coupled between a DC power supply and the amplifier, to: supply a current equal to the quiescent current to the amplifier from the DC power supply when the amplifier operates in the linear region; enable the amplifier to draw increasing current from the DC power supply above the quiescent current with increas- ing input signal power until the input signal power reaches the compression point level; and, then limits the current drawn by the amplifier from the DC power supply.

2. The system recited in claim 1 wherein when the amplifier operates in the linear region, the limiter circuit is in a low resistance state; and wherein when the limiter limits the current drawn by the amplifier from the DC power supply, the limiter is in a high resistance state.

3. A system, having an input terminal and an output terminal, comprising:
an amplifier connected to the input terminal for receiving an input signal at the input terminal and for producing an output signal at the output terminal, the amplifier having a linear operating region where an output signal produced by the amplifier at the output terminal has a power level increasing proportionally with the increasing input signal power level and a compression operating region where the output signal power produced by the amplifier has a compression power level, $P_{out\_cmpr}$, invariant with the input signal power level when the power of the input signal is above a predetermined input power level;
a DC current limiting circuit, coupled between a DC power supply and a bias terminal of the amplifier, for biasing the amplifier to limit the output power at the output terminal of the system to a level below the compression power level $P_{out\_cmpr}$ while enabling the output power of the system to vary proportionally with input signal power when the input signal power level is below the predetermined power level; and
wherein the DC current limiting circuit: allows the amplifier to draw current from the DC power supply through the DC current limiting circuit having a first, substantially constant, level for a first range of input signal power level; allows the current drawn from the DC power supply through the DC current limiting circuit to increase from the first substantially constant level to a second, higher, level for a range of input power level greater than the first range of input signal power level; and, inhibits the current being drawn from the DC power supply through the DC bias limiting circuit current from increasing above the second level for a third range of input signal power level greater than the second range of input signal power level.

4. A circuit, comprising
an amplifier having: an input terminal for receiving an input signal, an output terminal for producing an output signal; and a current supply terminal for receiving a bias current, the amplifier having a linear operating region and a compression region, the operating region of the amplifier being a function of the input signal and DC bias, the amplifier amplifying the input signal to produce the output signal;
a non-linear circuit coupled between a DC voltage supply and the current supply terminal, the DC voltage supply providing a current to the amplifier through the non-linear circuit, the current producing a voltage (ΔV) across the non-linear circuit, such voltage (ΔV) being a function of the input signal, the non-linear circuit operating in an ohmic region when (ΔV) has a first level, operating in a saturation region when (ΔV) has a second level greater than then first level, or operating in a transition region between the ohmic region and the saturation region when (ΔV) has a third level greater than the first level and lower than the second level, the non-linear circuit operating in the ohmic region when the input signal operates the amplifier in the linear region of the amplifier and the non-linear circuit operating in the saturation region when the input signal operates the amplifier in the in the compression region of the amplifier.

5. The amplifier system recited in claim 1 wherein the limiter comprises a Nonlinear Mesa Resistor (NMR) semiconductor device.

6. The amplifier system recited in claim 1 wherein the limiter comprises a Field Effect Transistor with Connected Gate and Source Electrodes.

7. A system, having an input terminal and an output terminal, comprising:
an amplifier connected to the input terminal for receiving an input signal at the input terminal and for producing an output signal at the output terminal, the amplifier having a linear operating region wherein the amplifier operates in accordance with the superposition principle and a compression operating region where the output signal power produced by the amplifier has a compression power level, $P_{out\_cmpr}$, invariant with the input signal power level when the power of the input signal is above a predetermined input power level; and
a DC current limiting circuit, coupled between a DC power supply and a bias terminal of the amplifier, for biasing the amplifier to limit the maximum output power at the output terminal of the system to a level below the compression power level $P_{out\_cmpr}$.

* * * * *